United States Patent
Kikuchi et al.

(10) Patent No.: US 8,653,754 B2
(45) Date of Patent: Feb. 18, 2014

(54) CURRENT DRIVING CIRCUIT

(75) Inventors: Hiroki Kikuchi, Kyoto (JP); Masao Yonemaru, Kyoto (JP); Takashi Oki, Kyoto (JP)

(73) Assignee: Rohm Co., Ltd. (JP)

( * ) Notice: Subject to any disclaimer, the term of this patent is extended or adjusted under 35 U.S.C. 154(b) by 406 days.

(21) Appl. No.: 13/008,125

(22) Filed: Jan. 18, 2011

(65) Prior Publication Data

US 2012/0025737 A1   Feb. 2, 2012

(30) Foreign Application Priority Data

Jan. 18, 2010 (JP) .................................. 2010-008368
Jan. 21, 2010 (JP) .................................. 2010-011199
Jan. 14, 2011 (JP) .................................. 2011-005504

(51) Int. Cl.
- *H05B 37/02* (2006.01)
- *H03K 3/26* (2006.01)
- *G05F 1/10* (2006.01)

(52) U.S. Cl.
USPC ........... 315/307; 315/291; 315/297; 315/308; 327/103; 327/108; 327/205; 327/539; 327/548

(58) Field of Classification Search
USPC .......... 315/291, 297, 307, 308; 327/103, 205, 327/538, 539, 543, 544, 548, 108
See application file for complete search history.

(56) References Cited

U.S. PATENT DOCUMENTS

| | | | |
|---|---|---|---|
| 7,737,733 B2 * | 6/2010 | Yokomizo et al. | 327/103 |
| 2002/0105373 A1 * | 8/2002 | Sudo | 327/538 |
| 2011/0001439 A1 * | 1/2011 | Cecconello et al. | 315/307 |

\* cited by examiner

*Primary Examiner* — Douglas W Owens
*Assistant Examiner* — Thai Pham
(74) *Attorney, Agent, or Firm* — Cantor Colburn LLP

(57) ABSTRACT

A current driving circuit may include a reference voltage input terminal; a resistor connection terminal; an output terminal via which the light emitting element is connected; a reference voltage generating unit; a transistor arranged such that one terminal thereof is connected to the resistor connection terminal; and an operational amplifier including first and second non-inverting input terminals and a single inverting input terminal, and arranged such that the output terminal thereof is connected to a control terminal of the transistor, the internal reference voltage is input to the first non-inverting input terminal, the external reference voltage is input to the second non-inverting input terminal, and the inverting input terminal thereof is connected to the resistor connection terminal. When the external resistor is connected between the resistor connection terminal and a ground terminal, a driving current is output via the output terminal.

7 Claims, 8 Drawing Sheets

COMPARISON TECHNIQUE

200

CURRENT DRIVING CIRCUIT

BACKGROUND OF THE INVENTION

1. Field of the Invention

The present invention relates to a current mirror circuit, or a current driving circuit.

2. Description of the Related Art

In a semiconductor integrated circuit, a current mirror circuit is employed in order to duplicate an electric current that flows through a given path. FIG. 1 is a circuit diagram which shows a configuration of a typical cascode current mirror circuit.

A current mirror circuit 200 duplicates an input current Iin that passes through an input terminal P1 so as to generate an output current Iout, and outputs the output current Iout thus generated via an output terminal P2. The current mirror circuit 200 includes a first transistor M1 through a fourth transistor M4, each of which is configured as a P-channel MOSFET, and a resistor R1. The first transistor M1, the second transistor M2, and the resistor R1 are connected in series in this order on a path for the input current Iin, i.e., between a power supply terminal P3 and the input terminal P1. The third transistor M3 and the fourth transistor M4 are connected in series in this order on a path for the output current Iout, i.e., between the power supply terminal P3 and the output terminal P2. The gate of the second transistor M2 and the gate of the fourth transistor M4 are both connected to the input terminal P1. Furthermore, the gate of the first transistor M1 and the gate of the third transistor M3 are both connected to the drain of the second transistor M2.

In order for an accurate proportional relation to be satisfied between the output current Iout and the input current Iin in the current mirror circuit 200 shown in FIG. 1, a relation in which the drain-source voltage VdsM1 of the first transistor M1 is equal to the drain-source voltage VdsM3 of the third transistor M3 must be satisfied.

The gate-source voltages of the first transistor M1, the second transistor M2, and the fourth transistor M4 will be represented by the symbols Vth1, Vth2, and Vth4, respectively. In this case, the gate voltages VA of the first transistor M1 and the third transistor M3 are each represented by the following Expression (1).

$$VA = Vcc - Vth1 \quad (1)$$

Furthermore, the gate voltages VB of the second transistor M2 and the fourth transistor M4 are each represented by the following Expression (2).

$$VB = Vcc - Vth1 - \Delta V \quad (2)$$

Here, $\Delta V = R1 \times Iin$.

In this case, the drain voltage VC of the first transistor M1 and the drain voltage VD of the third transistor M3 are represented by the following Expressions (3) and (4), respectively.

$$VC = VB + Vth3 = Vcc - Vth1 + Vth3 - \Delta V \quad (3)$$

$$VD = VB + Vth4 = Vcc - Vth1 + Vth4 - \Delta V \quad (4)$$

When the gate-source voltages Vth1 through Vth4 of all the transistors M1 through M4 are the same, the drain voltage VC of the first transistor M1 and the drain voltage VD of the third transistor M3 are each equal to (Vcc−ΔV). That is to say, the drain-source voltage VdsM1 of the first transistor M1 and the drain-source voltage VdsM3 of the third transistor m3 are each equal to ΔV. Thus, such an arrangement is capable of duplicating the input current Iin according to a predetermined mirror ratio.

However, when the input current Iin is small, the voltage drop ΔV that occurs at the resistor R1, i.e., the drain-source voltage of each of the first transistor M1 and the third transistor M3, becomes small. This leads to the mirror ratio deviating from its design value, resulting in a problem in that the output current Iout cannot be accurately generated.

Conversely, when the input current Iin is large, the voltage drop ΔV that occurs at the resistor R1 becomes large, leading to a reduction in the electric potential VB at the input terminal P1. As a result, the voltage between both terminals of a current source 202 configured to generate the input current Iin becomes small, leading to a problem in that the current source 202 cannot generate the input current Iin that should be supplied.

SUMMARY OF THE INVENTION

1. An embodiment of the present invention has been made in view of such a situation. Accordingly, it is an exemplary purpose of the present invention to provide a current mirror circuit which is capable of duplicating an input current Iin over a wide range.

An embodiment of the present invention relates to a current mirror circuit configured to duplicate an input current that flows through an input terminal, and to output an output current via an output terminal thereof. The current mirror circuit comprises: a first transistor, a second transistor, and a diode, arranged in series between a fixed voltage terminal to which a fixed voltage is to be applied and the input terminal; and a third transistor and a fourth transistor connected in series between the fixed voltage terminal and the output terminal. A gate of the first transistor and a gate of the third transistor are connected to a drain of the second transistor. A gate of the second transistor and a gate of the fourth transistor are connected to the input terminal.

With such an embodiment, the drain-source voltage of the first transistor and the drain-source voltage of the third transistor each become equal to the forward voltage VF of the diode regardless of the magnitude of the input current. As a result, such an arrangement is capable of duplicating the input current Iin with high accuracy over a wide range.

2. Another embodiment of the present invention relates to a current driving circuit configured to generate a driving current to be supplied to a light emitting element to be driven. The current driving circuit is configured as an IC integrated on a single semiconductor chip, and comprises: a reference voltage input terminal configured to receive an external reference voltage from an external circuit; a resistor connection terminal via which an external resistor is to be connected as an external component; an output terminal via which the light emitting element is to be connected; a reference voltage generating unit configured to generate an internal reference voltage; a transistor arranged such that one terminal thereof is connected to the resistor connection terminal; and an operational amplifier. The operational amplifier includes first and second non-inverting input terminals and a single inverting input terminal, and is configured to output, via an output terminal thereof, a voltage that corresponds to the difference between a voltage input to the inverting input terminal and a lower voltage selected from among voltages input to the first and second non-inverting input terminals. The operational amplifier is arranged such that the output terminal thereof is connected to a control terminal of the transistor, the internal reference voltage is input to the first non-inverting input terminal thereof, the external reference voltage is input to the second non-inverting input terminal thereof, and the inverting input terminal thereof is connected to the resistor connection terminal. In a state in which the external resistor is connected between the resistor connection terminal and a ground terminal, the current driving circuit outputs, via the output terminal, a driving current that corresponds to a current that flows through the transistor.

With such an embodiment, when the external reference voltage is not input to the reference voltage input terminal, i.e., when the reference voltage input terminal is set to a high-impedance state, or when a voltage that is higher than the internal reference voltage is input to the reference voltage input terminal, the driving voltage is generated according to the internal reference voltage. When a given external reference voltage is input to the reference voltage input terminal, such an arrangement is capable of generating the driving current according to the external reference voltage thus input. That is to say, such an arrangement allows the designer (user) of an electronic device to flexibly switch the value of the driving current.

Yet another embodiment of the present invention also relates to a current driving circuit. The current driving circuit is configured as an IC integrated on a single semiconductor chip, and comprises: a reference voltage source configured to generate a reference voltage; a first resistor and a second resistor arranged in series between an output terminal of the reference voltage source and a fixed voltage terminal; a reference voltage input terminal connected to a connection node that connects the first resistor and the second resistor, and configured to receive an external reference voltage from an external circuit; a resistor connection terminal via which an external resistor is connected as an external component; an output terminal via which the light emitting element is to be connected; a transistor arranged such that one terminal thereof is connected to the resistor connection terminal; and an operational amplifier arranged such that an output terminal thereof is connected to a control terminal of the transistor, a non-inverting input terminal thereof is connected to a connection node that connects the first resistor and the second resistor, and an inverting input terminal thereof is connected to the resistor connection terminal. In a state in which the external resistor is connected between the resistor connection terminal and a ground terminal, the current driving circuit outputs, via the output terminal, a driving current that corresponds to a current that flows through the transistor.

With such an embodiment, when the external reference voltage is not input to the reference voltage input terminal, i.e., when the reference voltage input terminal is set to a high-impedance state, the driving voltage is generated according to the internal reference voltage. When a given external reference voltage is input to the reference voltage input terminal, such an arrangement is capable of generating the driving current according to the external reference voltage thus input. That is to say, such an arrangement allows the user to flexibly switch the value of the driving current.

Also, a current driving circuit according to an embodiment may further comprise: a current mirror circuit configured to mirror a current that flows through the transistor; a third resistor arranged on a path for an output current of the current mirror; and a voltage/current conversion circuit configured to convert an intermediate voltage that occurs between both terminals of the third resistor into the driving current, and to output the driving current via the output terminal.

With a current driving circuit according to an embodiment, the other terminal of the transistor may be directly connected to the output terminal. Also, the current that flows through the transistor may be output as the driving current.

Yet another embodiment of the present invention relates to a light emitting apparatus. The light emitting apparatus comprises: a light emitting element; a current driving circuit according to any one of the aforementioned embodiments, configured to supply a driving current to the light emitting element; and an external resistor arranged between the resistor connection terminal of the current driving circuit and a ground terminal.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

First Embodiment

Figure 2:
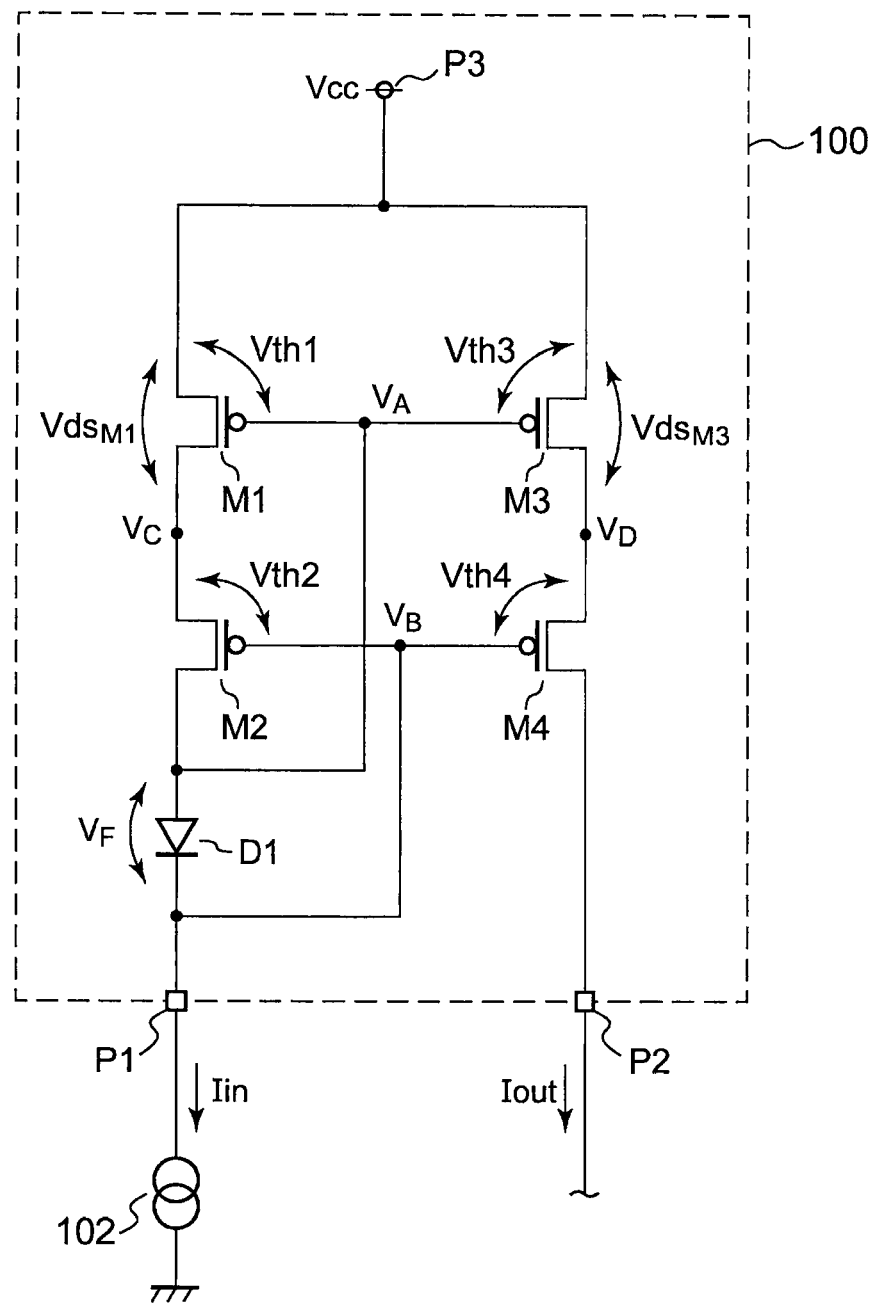
FIG. 2 is a circuit diagram which shows a configuration of a current mirror circuit according to a first embodiment.

FIG. 2 is a circuit diagram which shows a configuration of a current mirror circuit 100 according to a first embodiment. The current mirror circuit 100 duplicates an input current Iin that flows through an input terminal P1, and outputs an output current Iout via an output terminal P2.

$$Iout = K \times Iin$$

Here, K represents the mirror ratio of the current mirror circuit 100.

The current mirror circuit 100 is configured as a cascode current mirror circuit, and includes a first transistor M1 through a fourth transistor M4 and a diode D1. A power supply voltage Vcc, which is a fixed voltage, is applied to a power supply terminal P3. The first transistor M1 through the fourth transistor M4 are each configured as a MOSFET (Metal Oxide Semiconductor Field Effect Transistor) of the same conduction type. In an example shown in FIG. 2, each of these transistors is configured as a P-channel MOSFET.

The first transistor M1, the second transistor M2, and the diode D1 are connected in series in this order between the power supply terminal P3 and the input terminal P1. The diode D1 is arranged such that the cathode thereof is positioned on the input terminal P1 side, and the anode thereof is positioned on the drain side of the second transistor M2. The third transistor M3 and the fourth transistor M4 are arranged in this order between the power supply terminal P3 and the output terminal P2.

The gate of the first transistor M1 and the gate of the third transistor M3 are connected together, and are further connected to the drain of the second transistor M2 (anode of the diode D1). Furthermore, the gate of the second transistor M2 and the gate of the fourth transistor M4 are connected together, and are further connected to the input terminal P1 (cathode of the diode D1).

Figure 1:
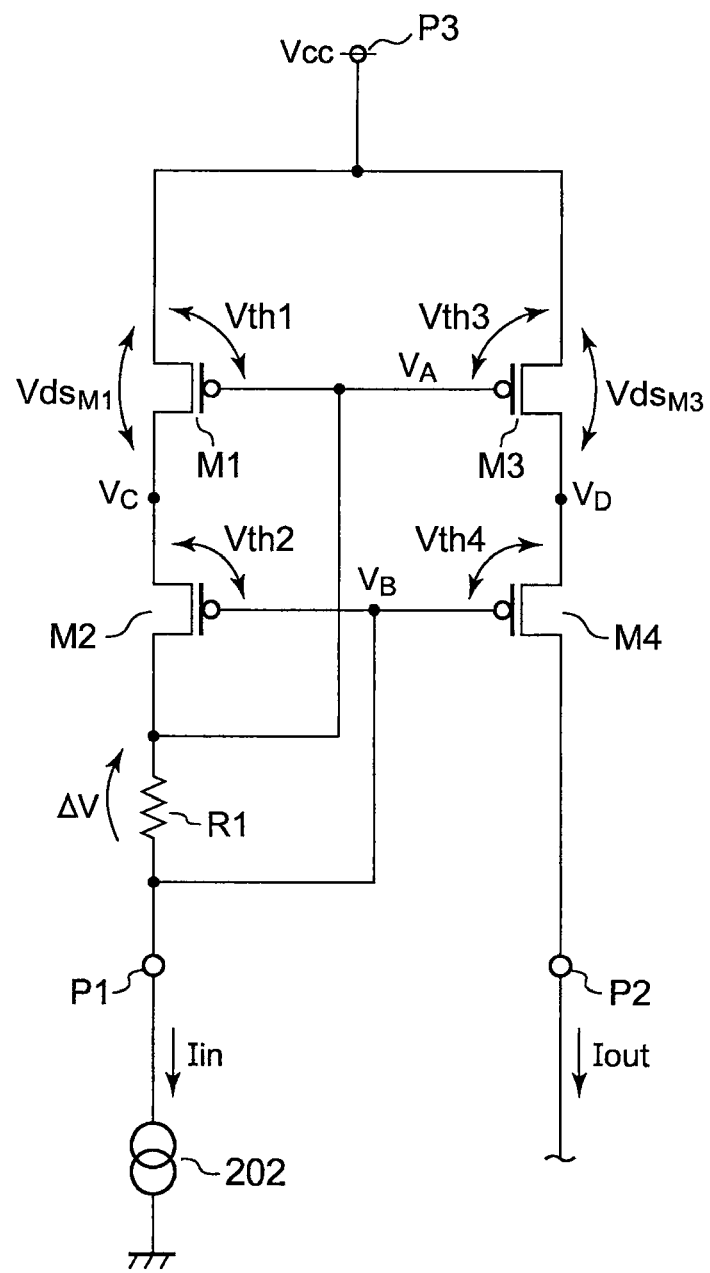
FIG. 1 is a circuit diagram which shows a configuration of a typical cascode current mirror circuit.

The above is the configuration of the current mirror circuit 100. Next, description will be made regarding the operation thereof. With the current mirror circuit 100 shown in FIG. 2, the following relation expressions, in which ΔV in the current mirror circuit 200 shown in FIG. 1 is replaced by VF, hold true.

$$VA = Vcc - Vth1 \quad (1)$$

$$VB = Vcc - Vth1 - VF \quad (2)$$

$$VC = VB + Vth3 = Vcc - Vth1 + Vth3 - VF \quad (3)$$

$$VD = VB + Vth4 = Vcc - Vth1 + Vth4 - VF \quad (4)$$

Figure 3A:
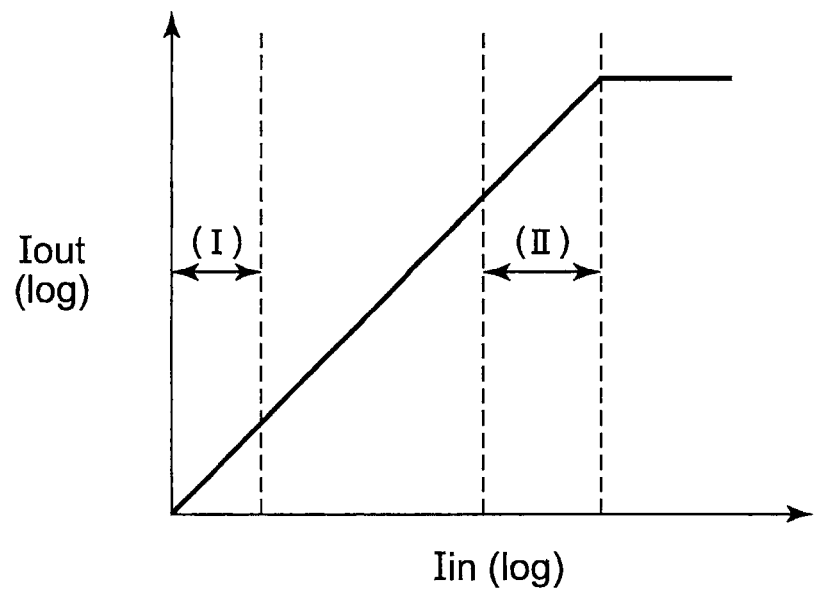
FIG. 3A is a graph which shows the input/output characteristics of the current mirror circuit shown in FIG. 2.
Figure 3B:
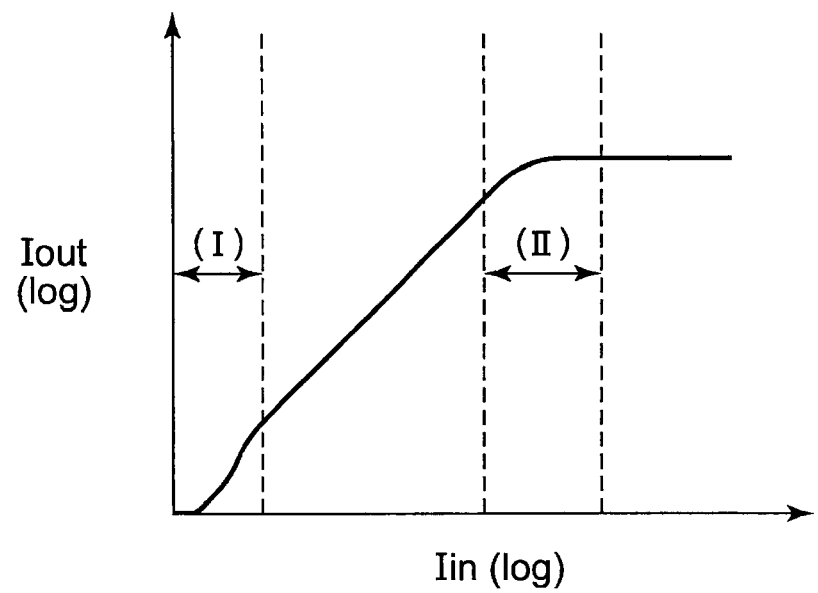
FIG. 3B is a graph which shows the input/output characteristics of the current mirror circuit shown in FIG. 1.

FIG. 3A shows the input/output characteristics of the current mirror circuit 100 shown in FIG. 2, and FIG. 3B shows the input/output characteristics of the current mirror circuit 200 shown in FIG. 1. FIGS. 3A and 3B are each double-logarithmic graphs in which the horizontal axis represents the input voltage Iin, and the vertical axis represents the output current Iout.

In comparison to the current mirror circuit 200 shown in FIG. 2, description will be made regarding the advantages of the current mirror circuit 100 shown in FIG. 2 with respect to a range (I) in which the input current Iin is small and a range (II) in which the input current Iin is large.

1. Small Current Range (I)

As described above, with the current mirror circuit 200 shown in FIG. 1, in a range in which the input current Iin is small, the voltage drop ΔV that occurs at the resistor R1, i.e., the drain-source voltage Vds of each of the first transistor M1 and the third transistor M3, becomes very small, leading to the mirror ratio deviating from its design value. As a result, as shown in FIG. 3B, a proportion relation between the input current Iin and the output current Iout is not satisfied.

In contrast, with the current mirror circuit 100 shown in FIG. 2, in a case in which the relation Vth1=Vth2=Vth3=Vth4 is satisfied, the drain-source voltage VdsM1 of the first transistor M1 and the drain-source voltage VdsM3 of the third transistor M3 are equal to each other, i.e., are each equal to VF. With such an arrangement, the forward voltage VF of the diode D1 is maintained at approximately a constant value regardless of the input voltage Iin that flows through the diode D1. Thus, the drain-source voltage Vds of each of the first transistor M1 and the second transistor M2 is maintained at approximately a constant value even if the input current Iin fluctuates. As a result, such an arrangement is capable of accurately duplicating the input current Iin at a predetermined mirror ratio K even if the input current Iin is in the range (I) in which the input current Iin is small.

2. Large Current Range (Ii)

Assuming that the current source 102 (202) can generate the input voltage Iin when the voltage difference applied to both terminals of the current source 102 (202) configured to generate the input current Iin is greater than a predetermined threshold voltage (minimum operation voltage Vs), in this case, the current mirror circuit 200 shown in FIG. 1 functions normally only in a range in which the relation Vcc−Vth1−Iin×R>Vs is satisfied. If the input current Iin becomes very large, the relation is not satisfied, leading to a problem in that the current mirror circuit 200 no longer functions normally.

In contrast, the current mirror circuit 100 shown in FIG. 2 functions normally in a range in which the relation Vcc−Vth1−VF>Vs is satisfied. The forward voltage VF of typical diodes is on the order of 0.7 V, which does not depend upon the input current Iin. Thus, the maximum value of the input current Iin that can be accurately duplicated is greater than that of the current mirror circuit 200 shown in FIG. 1.

As described above, the current mirror circuit 100 shown in FIG. 2 solves the aforementioned problems that occur in the current mirror circuit 200 shown in FIG. 1 that occur in a range in which the input current Iin is large and in a range in which the input current is small. That is to say, such an arrangement enables accurate duplication of the input current Iin over a wide range.

Figure 4A:
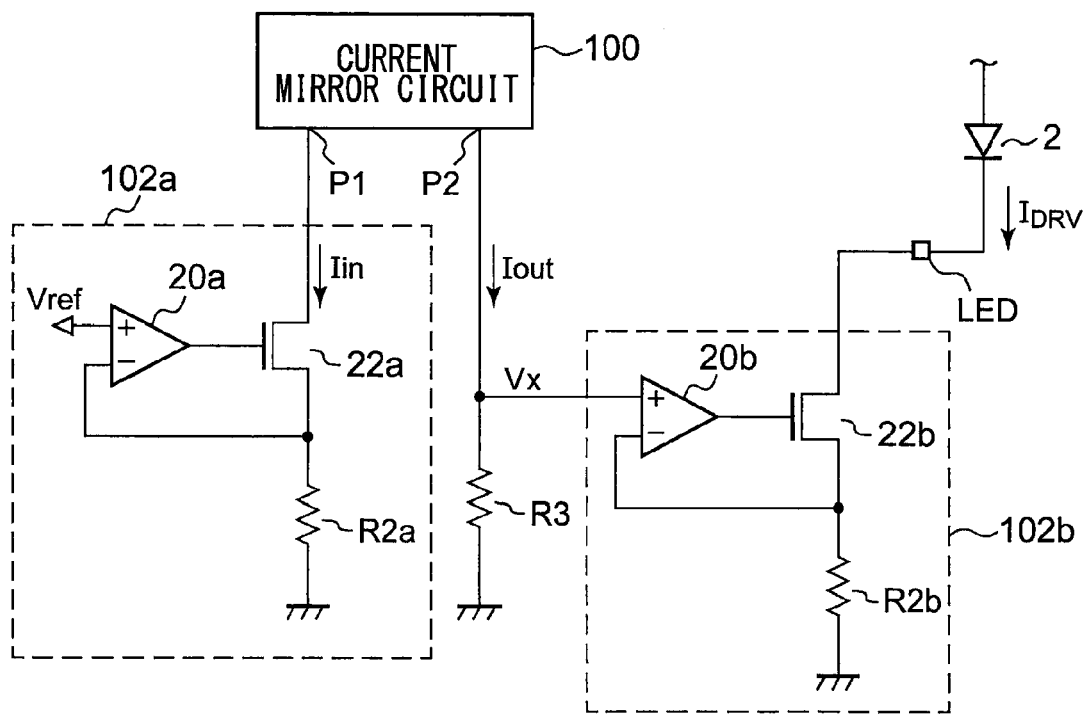
FIG. 4A is a circuit diagram which shows an LED driver employing the current mirror circuit shown in FIG. 2.
Figure 4B:
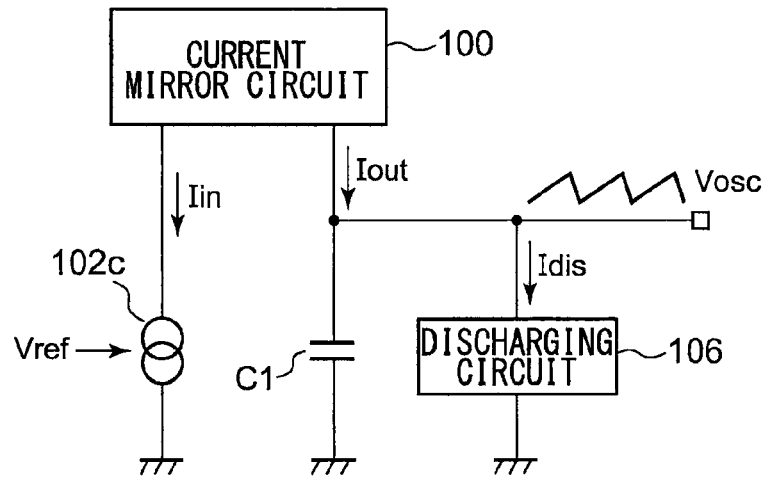
FIG. 4B is a circuit diagram which shows a configuration of an oscillator employing the current mirror circuit shown in FIG. 2.

Lastly, description will be made regarding an example of an application of the current mirror circuit shown in FIG. 2. FIG. 4A is a circuit diagram which shows a configuration of an LED driver employing the current mirror circuit 100 shown in FIG. 2, and FIG. 4B is a circuit diagram which shows a configuration of an oscillator employing the current mirror circuit 100.

An LED driver 300 shown in FIG. 4A supplies a driving current IDRV that corresponds to a reference voltage Vref to an LED2 connected to an LED terminal, thereby causing the LED2 to emit light with a luminance level that corresponds to the reference voltage Vref.

The LED driver 300 includes a first current source 102a, a second current source 102b, a resistor R3, and a current mirror circuit 100. The first current source 102 generates an input current Iin that is proportional to the reference voltage Vref. The current mirror circuit 100 duplicates the input current Iin generated by the first current source 102a, and generates an output current Iout. The resistor R3 is provided on a path for the output current Iout of the current mirror circuit 100. One terminal of the resistor R3 is set to a fixed electric potential. The second current source 102b generates a driving current IDRV that corresponds to a voltage drop Vx (=R3×

Iout) that occurs at the resistor R3, and supplies the driving current IDRV thus generated to the LED 2 to be driven.

The first current source 102a includes an operational amplifier 20a, a transistor 22a, and a resistor R2a, for example. The reference voltage Vref is input to a non-inverting input terminal of the operational amplifier 20a. The output terminal of the operational amplifier 20a is connected to the gate of the transistor 22a configured as an N-channel MOSFET. The resistor R2a is arranged between the ground terminal and the source of the transistor 22a. A connection node that connects the transistor 22a and the resistor R2a is connected to the inverting input terminal of the operational amplifier 20a. The first current source 102a generates the input current Iin represented by the Expression Iin=Vref/R2a.

The second current source 102b is configured in the same way as the first current source 102a. The second current source 102b generates a driving current IDRV represented by the Expression IDRV=Vx/R2b. It should be noted that the configuration of the first current source 102a and the second current source 102b is not restricted to such a configuration shown in FIG. 4A. Also, other configurations may be employed.

With the LED driver 300 shown in FIG. 4A, the driving current IDRV can be changed by changing the reference voltage Vref. By employing the current mirror circuit 100 shown in FIG. 2, the LED driver 300 is capable of generating the driving current IDRV over a wide range.

An oscillator 400 shown in FIG. 4B includes a current source 102c, a current mirror circuit 100, a capacitor C1, and a discharging circuit 106. The current source 102c generates a current Iin that corresponds to the reference voltage Vref. The electric potential at one terminal of the capacitor C1 is fixed. The current mirror circuit 100 duplicates the current Iin generated by the current source 102c, and charges the capacitor C1 with the output current Iout. The discharging circuit 106 discharges the capacitor C1 with the discharging current Idis. The oscillator 400 generates a cyclic signal Vosc by repeatedly alternating such a charging operation by means of the current mirror circuit 100 and such a discharging operation by means of the discharging circuit 106.

With the oscillator 400 shown in FIG. 4B, the frequency of the cyclic signal Vosc is changed according to the charging current supplied to the capacitor C1, i.e., the output current Iout of the current mirror circuit 100. The oscillator 400 shown in FIG. 4B enables the input current Iin of the current mirror circuit 100 to be changed over a wide range, thereby enabling the frequency of the cyclic signal Vosc to be changed over a wide range.

The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Figure 5:
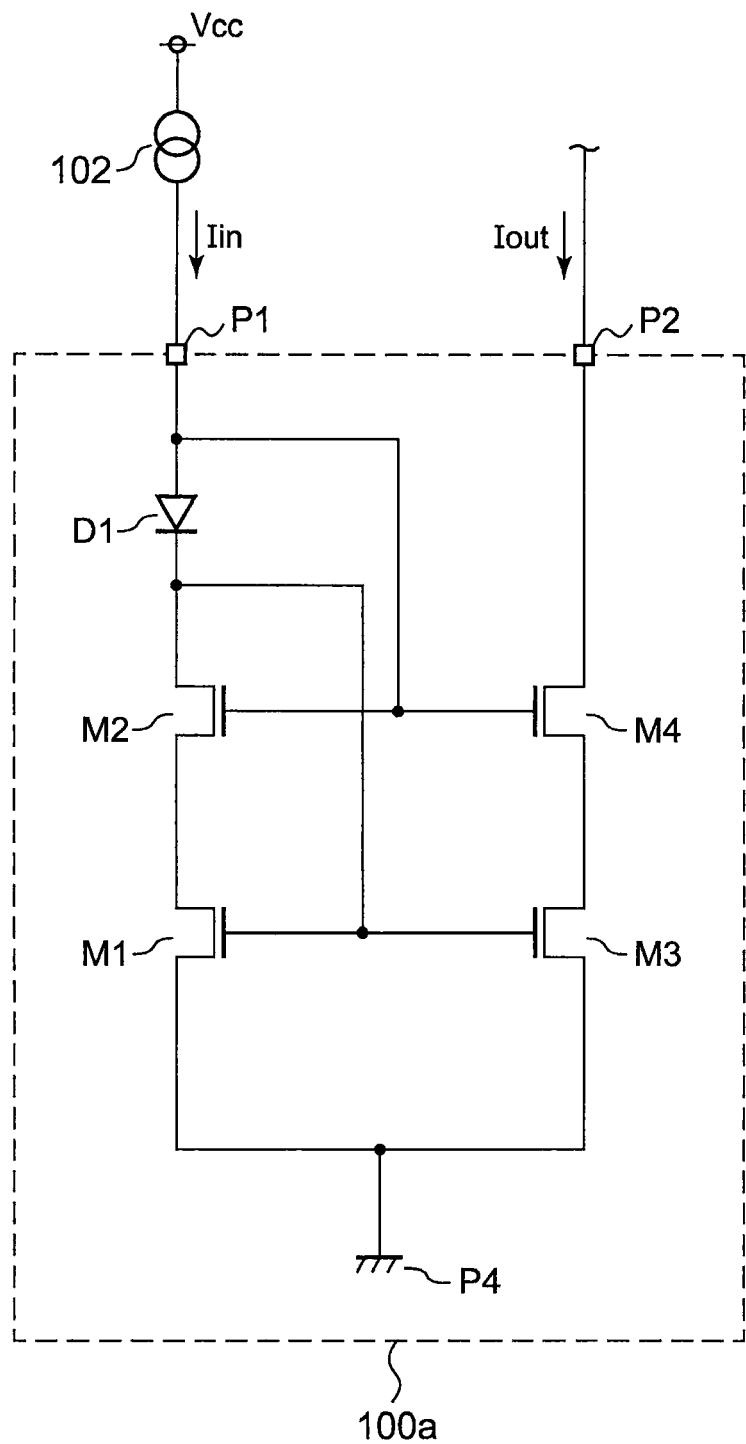
FIG. 5 is a circuit diagram which shows a configuration of a current mirror circuit according to a modification.

FIG. 5 is a circuit diagram which shows a configuration of a current mirror circuit 100a according to a modification. The current mirror circuit 100a shown in FIG. 5 has a configuration obtained by inverting the configuration the current mirror circuit 100 shown in FIG. 2. Specifically, in the configuration shown in FIG. 5, the first transistor M1 through the fourth transistor M4, each configured as a P-channel MOSFET in FIG. 2, are each replaced by an N-channel MOSFET, and the power supply terminal P3, which functions as a fixed voltage terminal as shown in FIG. 2, is replaced by a ground terminal P4. The other components shown in FIG. 5 are the same as those of the current mirror circuit 100 shown in FIG. 2.

The current mirror circuit 100a shown in FIG. 5 is capable of accurately duplicating the input current Iin over a wide range in the same way as with the current mirror circuit 100 shown in FIG. 2.

The current mirror circuit 100a shown in FIG. 5 can be applied to the LED driver 300 and the oscillator 400 shown in FIGS. 4A and 4B. Also, the current mirror circuit 100a shown in FIG. 5 can be applied to other applications.

Second and Third Embodiments

As a light source for a backlight of a liquid crystal panel or a light source provided to a cellular phone terminal as an incoming call indicator, a light emitting diode (LED) is employed. In order to enable such an LED to emit light at a desired luminance level, there is a need to supply a driving current to the LED according to the luminance level.

Figure 6:
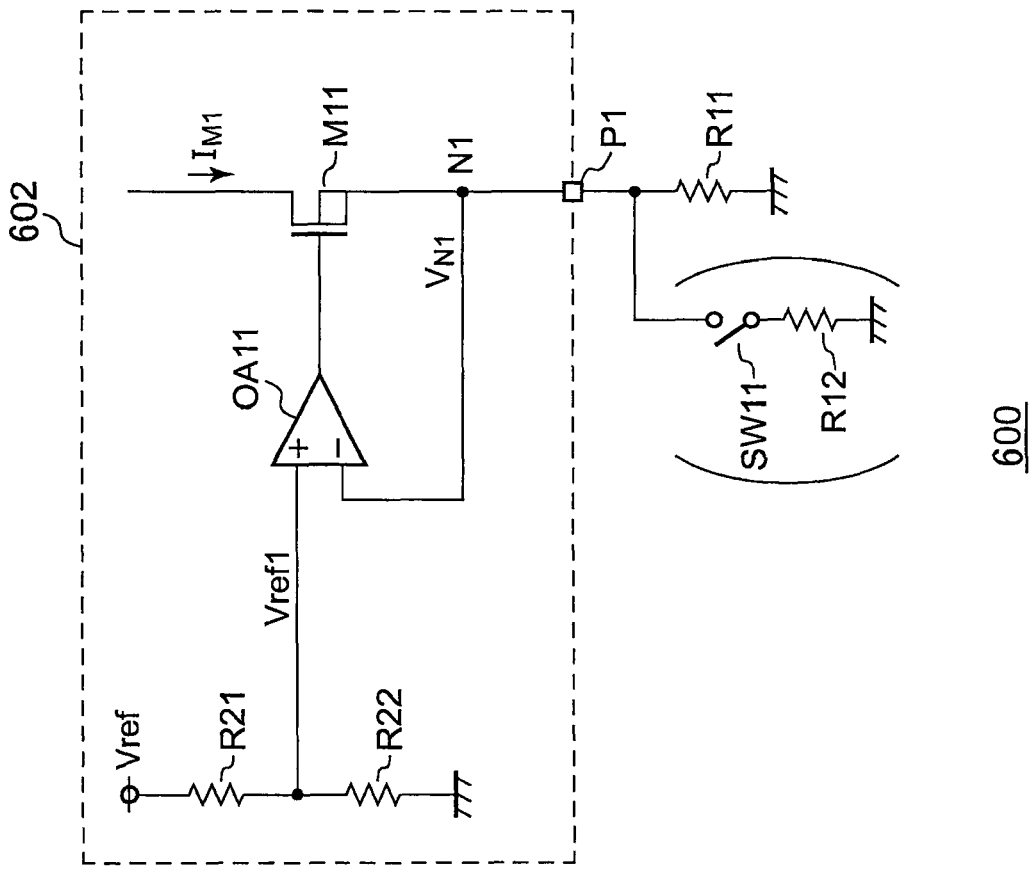
FIG. 6 is a circuit diagram which shows a part of a basic current driving circuit for an LED.

FIG. 6 is a circuit diagram which shows a part of a basic current driving circuit for an LED. A current driving circuit 600 includes a driving IC 602 and an external resistor R11. The driving IC 602 has a monolithically integrated configuration including resistors R21 and R22, an operational amplifier OA11, and a transistor M11. The driving IC 602 is provided with a terminal P1 which allows the resistor R11 to be connected as an external resistor.

The reference voltage Vref is generated by means of an unshown band gap reference circuit or the like. The resistors R21 and R22 are arranged to divide the reference voltage Vref. The reference voltage Vref1 thus divided is applied to a non-inverting input terminal of the operational amplifier OA11. The output voltage of the operational amplifier OA11 is applied to a control terminal (gate) of the transistor M11. The resistor R11 is connected as an external resistor between one terminal (source) of the transistor M11 and the ground terminal.

With the current driving circuit 600, a feedback operation is performed such that the electric potential VN1 at the connection node N1 between the transistor M11 and the resistor R11 matches the reference voltage Vref1. As a result, a current IM1 represented by the Expression IM1=Vref1/R11 flows through a path including the transistor M11 and the resistor R11. The current driving circuit 600 supplies a driving current ILED to an LED (not shown) to be driven that is proportional to the current IM1.

In some cases, depending on the kind of application, there is a demand for an arrangement which allows an external circuit to adjust the luminance level of the LED. Known examples of such a method include: a PWM dimming method, in which a switching operation is performed for the driving current ILED and the luminance level is changed according to the duty ratio of the switching operation; and an analog dimming method, in which the current value (amplitude) of the driving current ILED is changed.

With the conventional driving IC 602, the reference voltage Vref1 is constant. Accordingly, in order to switch the driving current ILED for the analog dimming operation, the impedance of the resistor connected to the terminal P1 should be switched. FIG. 6 shows an arrangement including a resistor R12 and a switch SW11 in order to switch the combined impedance of the resistors connected to the terminal P1.

However, with such a method, the value of the current IM1 which can be generated is limited by the combination of the resistors R11 and R12, leading to a problem in that it is difficult to generate a desired current. Also, such a method has a disadvantage in that it requires a large number of external components.

Description will be made below regarding a technique for solving such a problem.

Figure 7:
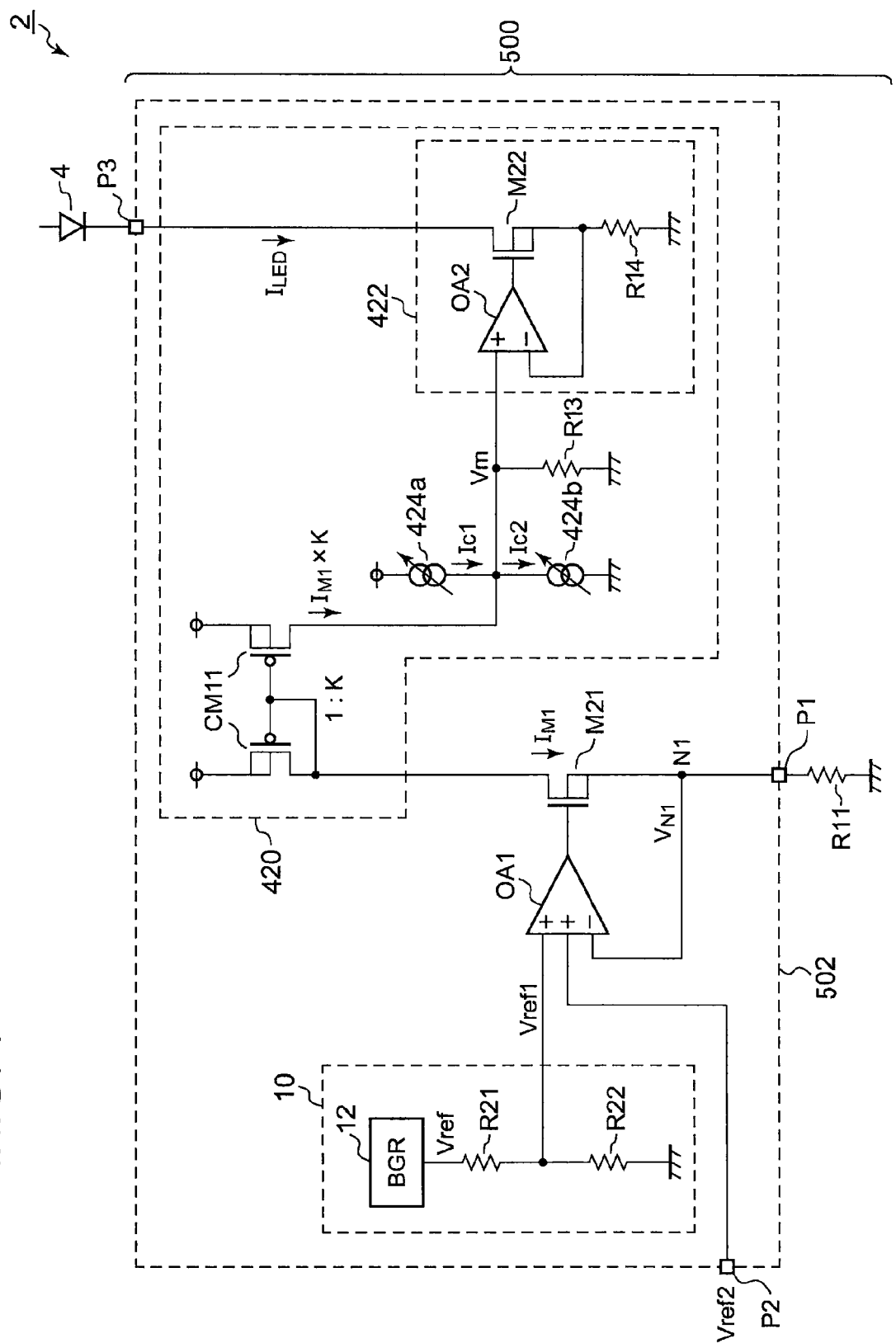
FIG. 7 is a circuit diagram which shows a configuration of a light emitting apparatus including a current driving circuit according to a second embodiment.

FIG. 7 is a circuit diagram which shows a configuration of a light emitting apparatus 2 including the current driving circuit 500 according to the second embodiment. The current driving circuit 500 includes a driving IC 502 and an external resistor R11. The driving IC 502 is monolithically integrated on a single semiconductor chip or in a single semiconductor module.

The driving IC 502 includes a resistor connection terminal P1, a light emitting apparatus 2, and an LED terminal P3. The LED terminal P3 is connected to the cathode of an LED 4 to be driven. The external resistor R11 is connected between the resistor connection terminal P1 and the ground terminal. An external reference voltage Vref2 is input to a reference voltage input terminal P2.

The driving IC 502 includes a reference voltage generating unit 10, an operational amplifier OA1, a transistor M21, and a current amplifier circuit 420.

The reference voltage generating unit 10 generates an internal reference voltage Vref1. For example, the reference voltage generating unit 10 includes a band gap reference circuit (reference voltage source) 12 and resistors R21 and R22. The band gap reference circuit 12 generates a reference voltage Vref. The resistor R21 and R22 divide the reference voltage Vref so as to generate the internal reference voltage Vref1.

The transistor M21 is configured as an N-channel MOSFET (Metal Oxide Semiconductor Field Effect Transistor) arranged such that one terminal (source) thereof is connected to the resistor connection terminal P1. The operational amplifier OA1 includes first and second non-inverting input terminals and a single inverting input terminal. The operational amplifier OA1 outputs, via the output terminal thereof, a voltage that corresponds to the difference between the lower of the voltages input to the first and second non-inverting input terminals and the voltage input to the inverting input terminal. The output terminal of the operational amplifier OA1 is connected to a control terminal (gate) of the transistor M21, and the internal reference voltage Vref1 is input to the first non-inverting input terminal. Furthermore, the external reference voltage Vref2 is input to the second non-inverting terminal of the operational amplifier OA1. The inverting input terminal of the operational amplifier OA1 is connected to the resistor connection terminal P1. The electric potential VN1 at the connection node N1 that connects the transistor M21 and the external resistor R11 is input to the inverting input terminal of the operational amplifier OA1.

The current amplifier circuit 420 amplifies the current IM1 that flows through the transistor M21 so as to generate the driving current ILED, and outputs the driving current ILED via the LED terminal (output terminal) P3. The current amplifier circuit 420 includes a current mirror circuit CM11, a conversion resistor R13, and a voltage/current conversion circuit 422. The current mirror circuit CM11 duplicates the current IM1 that flows through the transistor M21 with a mirror ratio K, and returns the current thus mirrored. The conversion resistor R13 is provided on a path for the output current (IM1×K) of the current mirror circuit CM11, and is arranged such that one terminal thereof is set to a fixed electric potential. A voltage drop (which will be referred to as the "intermediate voltage" hereafter) Vm that is proportional to the current (IM1×K) occurs between both terminals of the conversion resistor R13.

$$Vm = IM1 \times K \times R13$$

The voltage/current conversion circuit 422 converts the intermediate voltage Vm into the driving current ILED, and outputs the driving current ILED via the LED terminal P3. The voltage/current conversion circuit 422 includes an operational amplifier OA2, a transistor M22, and a resistor R14. The configuration and operation of the voltage/current conversion circuit 422 are the same as those of the circuit including the operational amplifier OA1, the transistor M21, and the external resistor R11.

The driving current ILED generated by the voltage/current conversion circuit 422 is represented by the following Expression.

$$ILED = (IM1 \times K) \times R13 / R14$$

With such an arrangement, the conversion resistor R13 and the resistor R14 are formed in a pairing formation. The resistance value ratio between these resistors, i.e., (R13/R14), is maintained at an approximately constant level regardless of process irregularities. However, the mirror ratio K and the value of the current IM1 each fluctuate due to semiconductor irregularities, leading to deterioration in the accuracy of the driving current ILED. Alternatively, such an arrangement leads to irregularities in the driving current ILED due to the offset voltage of the operational amplifier.

In order to solver such a problem, the current amplifier circuit 420 includes repair circuits 424a and 424b. The repair circuits 424a and 424b respectively generate repair currents Ic1 and Ic2 that are proportional to the current that flows through the transistor M21. The repair circuits 424a and 424b are configured employing current mirror circuits configured to be capable of switching the respective mirror ratios K1 and K2.

$$Ic1 = K1 \times IM1$$

$$Ic2 = K2 \times IM1$$

By means of the repair circuits 424a and 424b, the current that flows through the conversion resistor R13 is corrected to be a value represented by the Expression IM1'=IM1×(K+K1−K2). That is to say, by employing the repair circuits 424a and 424b, such an arrangement is capable of canceling out irregularities in the mirror ratio K of the current mirror circuit CM11 or the offset voltage of the operational amplifier.

The above is the configuration of the current driving circuit 500. Next, description will be made regarding the operation thereof. In a state in which the external resistor R11 is connected between the resistor connection terminal P1 and the ground terminal, the current driving circuit 500 outputs, via the LED terminal P3, the driving current ILED that corresponds to the current IM1 that flows through the transistor M21.

The current driving circuit 500 operates in the following two operation modes.

[First Mode]

When the external reference voltage Vref2 is not input to the reference voltage input terminal P2 (when the reference voltage input terminal P2 is set to a high-impedance state), or when a voltage that is higher than the internal reference voltage Vref1 is input to the reference voltage terminal P2, a feedback operation is performed such that the electric potential VN1 at the connection node N1 (resistor connection terminal P1) that connects the transistor M21 and the external resistor R11 matches the internal reference voltage Vref1. In this case, the current IM1 that flows through the transistor M21 is represented by the Expression IM1=Vref1/R11.

[Second Mode: External Dimming Mode]

When the reference voltage Vref2 that is lower than the internal reference voltage Vref1 is supplied to the reference voltage input terminal P2, a feedback operation is performed such that the electric potential VN1 at the connection node N1 (resistor connection terminal P1) that connects the transistor M21 and the external resistor R11 matches the external reference voltage Vref2. In this case, the current IM1 that flows through the transistor M21 is represented by the Expression IM1=Vref2/R11. Thus, such an arrangement is capable of providing the driving current ILED that is proportional to the reference voltage Vref supplied from an external circuit.

That is to say, the current driving circuit 500a allows an external circuit to flexibly adjust the current IM1 that flows through the transistor M21 and the driving current ILED, thereby providing an analog dimming operation. In this case, unlike an arrangement shown in FIG. 6, such an arrangement requires neither an additional switch nor a resistor as an external component. Thus, such an arrangement provides a reduced circuit area and reduced costs.

Third Embodiment

Figure 8:
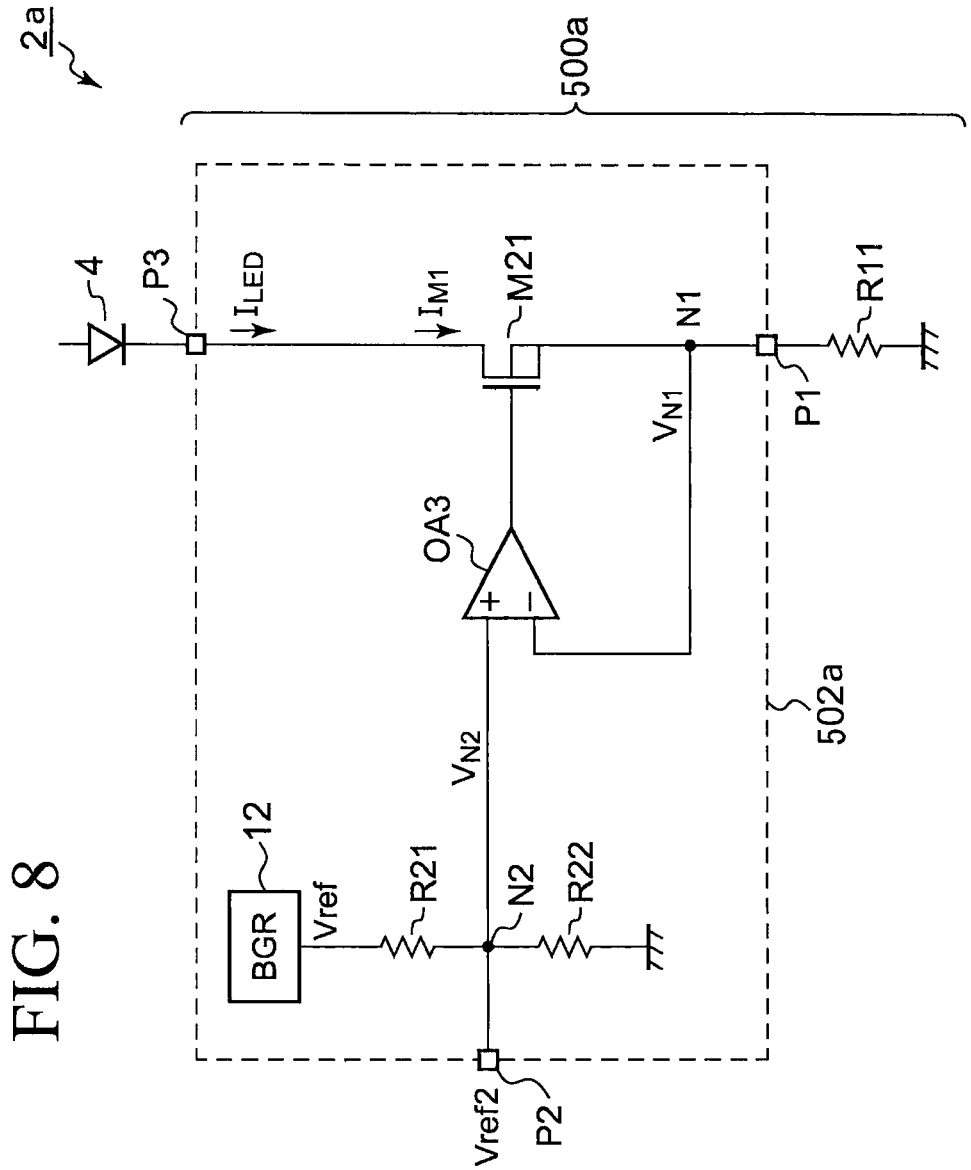
FIG. 8 is a circuit diagram which shows a configuration of a light emitting apparatus including a current driving circuit according to a third embodiment.

FIG. 8 is a circuit diagram which shows a configuration of a light emitting apparatus 2a including the current driving circuit 500a according to a third embodiment. The current driving circuit 500a includes a driving IC 502a and an external resistor R11. The driving IC 502a is monolithically integrated on a single semiconductor chip or in a single semiconductor module.

The driving IC 502a includes a resistor connection terminal P1, a reference voltage input terminal P2, and an LED terminal P3, in the same way as the driving IC 502 shown in FIG. 7.

The driving IC 502 includes a band gap reference circuit 12, a first resistor R21, a second resistor R22, and an operational amplifier OA3.

The band gap reference circuit 12 generates a reference voltage Vref. The first resistor R21 and the second resistor R22 are connected in series between the output terminal of the band gap reference circuit 12 and the ground terminal. The reference voltage input terminal P2 is connected to a connection node N2 that connects the first resistor R21 and the second resistor R22.

The operational amplifier OA3 is arranged such that the output terminal thereof is connected to a control terminal of the transistor M21, the non-inverting input terminal thereof is connected to the connection node N2 that connects the first resistor R21 and the second resistor R22, and the inverting input terminal thereof is connected to the resistor connection terminal P1.

The above is the configuration of the driving IC 502a. Next, description will be made regarding the operation thereof. In a state in which the external resistor R11 is connected between the resistor connection terminal P1 and the ground terminal, the driving IC 502a outputs, via the output terminal P3, the driving current ILED that corresponds to the current IM1 that flows through the transistor M21.

The current driving circuit 500a operates in the following two operation modes.

[First Mode]

When the external reference voltage Vref2 is not input to the reference voltage input terminal P2 (when the reference voltage input terminal P2 is set to a high-impedance state), the voltage VN2 input to the non-inverting input terminal of the operational amplifier OA3 is represented by the Expression VN2=Vref×(R22/(R21+R22))=Vref1. In this case, a feedback operation is performed such that the electric potential VN1 at the connection node N1 (resistor connection terminal P1) that connects the transistor M21 and the external resistor R11 matches the internal reference voltage Vref1. Thus, the current IM1 that flows through the transistor M21 is represented by the Expression IM1=Vref1/R11.

[Second Mode: External Dimming Mode]

When the external reference voltage Vref2 is supplied to the reference voltage input terminal P2, the voltage VN2 input to the non-inverting input terminal of the operational amplifier OA3 becomes equal to the external reference voltage Vref2.

$VN2=Vref2$

In this case, a feedback operation is performed such that the electric potential VN1 at the connection node N1 (resistor connection terminal P1) that connects the transistor M21 and the external resistor R11 matches the external reference voltage Vref2. Thus, the current IM1 that flows through the transistor M21 is represented by the Expression IM1=Vref2/R11.

That is to say, the current driving circuit 500a allows an external circuit to flexibly adjust the current IM1 that flows through the transistor M21 and the driving current ILED, thereby providing an analog dimming operation. In this case, such an arrangement requires neither an additional switch nor a resistor as an external component, unlike an arrangement shown in FIG. 6. Thus, such an arrangement provides a reduced circuit area and reduced costs.

Description has been made regarding an arrangement according to the present invention with reference to the embodiments. The above-described embodiments have been described for exemplary purposes only, and are by no means intended to be interpreted restrictively. Rather, various modifications may be made to the aforementioned components, processes, and combinations thereof. Description will be made below regarding such modifications.

For example, the current driving circuit 500a shown in FIG. 8 may include the current amplifier circuit 420 in the same way as the current driving circuit 500 shown in FIG. 7. Conversely, the current amplifier circuit 420 may be omitted from the current driving circuit 500 shown in FIG. 7.

Description has been made in the embodiment regarding an arrangement configured to drive an LED which is a light emitting element. Also, the current driving circuit according to the embodiment can be applied to arrangements configured to drive other kinds of devices.

The current mirror circuit 100 according to the first embodiment can be suitably employed as a current mirror circuit used in the second or third embodiment.

In any one of the above-described embodiments, each MOSFET may be replaced by a bipolar transistor.

While the preferred embodiments of the present invention have been described using specific terms, such description is for illustrative purposes only, and it is to be understood that changes and variations may be made without departing from the spirit or scope of the appended claims.

What is claimed is:

1. A current driving circuit configured to generate a driving current being supplied to a light emitting element being driven, the current driving circuit comprising:
   a reference voltage input terminal configured to receive an external reference voltage from an external circuit;
   a resistor connection terminal via which an external resistor is connected as an external component;

an output terminal via which the light emitting element is connected;

a reference voltage generating unit configured to generate an internal reference voltage;

a transistor arranged such that one terminal thereof is connected to the resistor connection terminal; and an operational amplifier including first and second non-inverting input terminals and a single inverting input terminal, configured to output, via an output terminal thereof, a voltage that corresponds to the difference between a voltage input to the inverting input terminal and a lower voltage selected from among voltages input to the first and second non-inverting input terminals, and arranged such that the output terminal thereof is connected to a control terminal of the transistor, the internal reference voltage is input to the first non-inverting input terminal thereof, the external reference voltage is input to the second non-inverting input terminal thereof, and the inverting input terminal thereof is connected to the resistor connection terminal, wherein, in a state in which the external resistor is connected between the resistor connection terminal and a ground terminal, a driving current that corresponds to a current that flows through the transistor is output via the output terminal.

2. A current driving circuit according to claim 1, further comprising:

a current mirror circuit configured to mirror a current that flows through the transistor;

a conversion resistor arranged on a path for an output current of the current mirror; and a voltage/current conversion circuit configured to convert an intermediate voltage that occurs between both terminals of the conversion resistor into the driving current, and to output the driving current via the output terminal.

3. A current driving circuit according to claim 1, wherein the other terminal of the transistor is directly connected to the output terminal, and wherein the current that flows through the transistor is output as the driving current.

4. A light emitting apparatus comprising:

a light emitting element;

a current driving circuit according to claim 1, configured to supply a driving current to the light emitting element; and an external resistor arranged between the resistor connection terminal of the current driving circuit and a ground terminal.

5. A current driving circuit configured to generate a driving current being supplied to a light emitting element being driven, the current driving circuit comprising:

a reference voltage source configured to generate a reference voltage;

a first resistor and a second resistor arranged in series between an output terminal of the reference voltage source and a fixed voltage terminal;

a reference voltage input terminal connected to a connection node that connects the first resistor and the second resistor, and configured to receive an external reference voltage from an external circuit;

a resistor connection terminal via which an external resistor is connected as an external component;

an output terminal via which the light emitting element is connected;

a transistor arranged such that one terminal thereof is connected to the resistor connection terminal;

an operational amplifier arranged such that an output terminal thereof is connected to a control terminal of the transistor, a non-inverting input terminal thereof is connected to a connection node that connects the first resistor and the second resistor, and an inverting input terminal thereof is connected to the resistor connection terminal;

a current mirror circuit configured to mirror a current that flows through the transistor;

a conversion resistor arranged on a path for an output current of the current mirror circuit; and a voltage/current conversion circuit configured to convert an intermediate voltage that occurs between both terminals of the conversion resistor, and to output the driving voltage via the output terminal, wherein, in a state in which the external resistor is connected between the resistor connection terminal and a ground terminal, a driving current that corresponds to a current that flows through the transistor is output via the output terminal.

6. A current driving circuit according to claim 5, wherein the other terminal of the transistor is directly connected to the output terminal, and wherein the current that flows through the transistor is output as the driving current.

7. A light emitting apparatus comprising:

a light emitting element;

a current driving circuit according to claim 5, configured to supply a driving current to the light emitting element; and an external resistor arranged between the resistor connection terminal of the current driving circuit and a ground terminal.

* * * * *